United States Patent
Wada et al.

(10) Patent No.: US 11,145,646 B2
(45) Date of Patent: Oct. 12, 2021

(54) SEMICONDUCTOR DEVICE

(71) Applicant: HITACHI AUTOMOTIVE SYSTEMS, LTD., Ibaraki (JP)

(72) Inventors: Shinichirou Wada, Tokyo (JP); Katsumi Ikegaya, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 0 days.

(21) Appl. No.: 16/624,166

(22) PCT Filed: Apr. 16, 2018

(86) PCT No.: PCT/JP2018/015647
§ 371 (c)(1),
(2) Date: Dec. 18, 2019

(87) PCT Pub. No.: WO2018/235410
PCT Pub. Date: Dec. 27, 2018

(65) Prior Publication Data
US 2020/0227409 A1    Jul. 16, 2020

(30) Foreign Application Priority Data
Jun. 19, 2017  (JP) .............................. JP2017-119633

(51) Int. Cl.
*H01L 27/088*    (2006.01)
*H01L 29/78*    (2006.01)
(Continued)

(52) U.S. Cl.
CPC ............ *H01L 27/088* (2013.01); *G05F 1/567* (2013.01); *H01L 27/0207* (2013.01); *H01L 2027/11805* (2013.01)

(58) Field of Classification Search
CPC . H01L 27/088; H01L 27/0207; H01L 27/092; H01L 29/7825; H01L 27/06; G05F 1/567
See application file for complete search history.

(56) References Cited

U.S. PATENT DOCUMENTS 6,307,236 B1 * 10/2001 Matsuzaki ........ H01L 21/82345
257/392
2011/0063892 A1 * 3/2011 Kajigaya .................. G11C 7/06
365/149

(Continued)

FOREIGN PATENT DOCUMENTS

JP    H07-58326 A    3/1995
JP    2006-203415 A    8/2006
(Continued)

OTHER PUBLICATIONS

International Search Report for PCT/JP2018/015647, dated Jul. 17, 2018.

*Primary Examiner* — Mohsen Ahmadi
(74) *Attorney, Agent, or Firm* — Volpe Koenig

(57) ABSTRACT

Restraining a reduction in an electric current detection accuracy, which is due to the temperature difference between an output MOS transistor and a sense MOS transistor, and easing a limitation on the layout of the sense MOS transistor. A semiconductor device includes: an output MOS transistor that has an output transistor portion including a source, a gate, and a drain formed on a semiconductor chip, and outputs an electric current for driving an external load; and a sense MOS transistor that has a sense transistor portion including a source, a gate, and a drain formed on the semiconductor chip, and having a width equal to a transverse width of the output transistor portion, and that detects the electric current output from the output MOS transistor.

7 Claims, 7 Drawing Sheets

(51) Int. Cl.
  *H03K 17/14*   (2006.01)
  *H03K 17/687*  (2006.01)
  *G05F 1/567*   (2006.01)
  *H01L 27/02*   (2006.01)
  *H01L 27/118*  (2006.01)

(56) References Cited

U.S. PATENT DOCUMENTS

| | | | |
|---|---|---|---|
| 2012/0292662 | A1 | 11/2012 | Matsuura et al. |
| 2013/0064000 | A1* | 3/2013 | Hamada ............... G11C 11/5685 365/148 |
| 2013/0105913 | A1 | 5/2013 | Hirotsu et al. |
| 2013/0193507 | A1* | 8/2013 | Yoshida .......... H01L 21/823487 257/329 |
| 2015/0014687 | A1* | 1/2015 | Nakajima ............ H03K 17/567 257/48 |
| 2016/0352316 | A1* | 12/2016 | Akama ................... G05F 1/565 |
| 2016/0352320 | A1* | 12/2016 | Nagase .............. H03K 17/0828 |
| 2017/0354004 | A1* | 12/2017 | Park ..................... H05B 45/375 |
| 2018/0294709 | A1* | 10/2018 | Araki ...................... H02M 1/08 |
| 2019/0259327 | A1* | 8/2019 | Li ........................ G09G 3/3233 |

FOREIGN PATENT DOCUMENTS

| | | |
|---|---|---|
| JP | 2007-287988 A | 11/2007 |
| JP | 2012-009763 A | 1/2012 |
| JP | 2012-256839 A | 12/2012 |

* cited by examiner

SEMICONDUCTOR DEVICE

TECHNICAL FIELD

The present invention relates to a semiconductor device for detecting an electric current that flows through a semiconductor element for outputting a controlled electric current to an external load.

BACKGROUND ART

Semiconductor devices for controlling an electric current are used to drive loads such as solenoids or the like. Semiconductor devices for controlling an electric current are required to control a large electric current on the order of amperes with high accuracy. For controlling an electric current with high accuracy, it is necessary to detect the electric current with high accuracy. According to one known circuit of an electric current detecting unit for detecting an electric current with high accuracy at a relatively low cost in a semiconductor device for controlling an electric current, the electric current detecting unit that employs a sense MOS transistor is connected parallel to an output MOS transistor that drives the electric current (see Patent Document 1). An energy loss that is caused by the electric current detecting unit is reduced by reducing the gate width of the sense MOS transistor with respect to the gate width of the output MOS transistor to a ratio of 1/1000, for example.

The electric current detection accuracy in an electric current detection by the sense MOS transistor is determined by the accuracy of an electric current ratio of the output MOS transistor and the sense MOS transistor. The electric current value of the sense MOS transistor with respect to the electric current value of the output MOS transistor is referred to as a sense ratio.

Generally, since the output MOS transistor and the sense MOS transistor are of the same unit structure, when they drive the electric current, they have the same electric power density, generating heat by themselves. However, the heat radiating capability of the larger-size output MOS transistor is poorer than the smaller-size sense MOS transistor. Therefore, the internal temperature of the output MOS transistor becomes higher than the internal temperature of the sense MOS transistor. The larger the heat value is, the larger the temperature difference becomes. Consequently, as the amount of the driving electric current increases, the sense ratio decreases, resulting in a reduction in the accuracy with which the electric current is detected.

A technology for reducing a reduction in an electric current detection accuracy, which is due to the temperature difference between the output MOS transistor and the sense MOS transistor, is disclosed in Patent Document 2. According to the technology disclosed in Patent Document 2, a channel of a multi-finger MOS transistor that makes up an output MOS transistor is used as a channel for a sense MOS transistor. Furthermore, if it is assumed that the distance from the center of the multi-finger MOS transistor to a remotest channel is indicated by L, then a channel that is closest to the position $(L/(\sqrt{3}))$ from the center of the multi-finger MOS transistor is used as the sense MOS transistor. With this arrangement, the temperature of the sense MOS transistor becomes equal to the average temperature of the output MOS transistor. As a result, the temperature difference between the output MOS transistor and the sense MOS transistor upon driving the electric current is eliminated, thereby restraining a reduction in an electric current detection accuracy, which is due to the temperature difference.

PRIOR ART DOCUMENT

Patent Documents

Patent Document 1: JP-2006-203415-A
Patent Document 2: JP-2012-9763-A

SUMMARY OF THE INVENTION

Problems to be Solved by the Invention

However, the technology of Patent Document 2 puts a limitation on the layout of the sense MOS transistor. As illustrated in FIG. 3 of Patent Document 2, a semiconductor device disclosed in Patent Document 2 includes an array of MOS transistors arranged in X and Y directions, most of the MOS transistors being used as output MOS transistors and some inner MOS transistors as sense MOS transistors. With such an arrangement, the layout of interconnects of the output MOS transistors are made irregular due to interconnects that lead outwardly from the electrodes of the sense MOS transistors. As a result, the interconnects of the output MOS transistors have uneven parasitic resistances, tending to cause electric current densities to deviate between the MOS transistors. The deviating electric current densities tend to be responsible for an increased loss by the output MOS transistors and a reduction in the reliability of the devices.

It is an object of the present invention to provide a technology for restraining a reduction in an electric current detection accuracy, which is due to the temperature difference between an output MOS transistor and a sense MOS transistor, and for easing a limitation on the layout of the sense MOS transistor.

Means for Solving the Problems

A semiconductor device according to an aspect of the present invention includes: an output MOS transistor that has an output transistor portion including a source, a gate, and a drain formed on a semiconductor chip, and that outputs an electric current for driving an external load; and a sense MOS transistor that has a sense transistor portion including a source, a gate, and a drain formed on the semiconductor chip, and having a width equal to a transverse width of the output transistor portion, and that detects the electric current output from the output MOS transistor.

Advantages of the Invention

Since the output transistor portions and the sense transistor portion have the same width, it is possible to restrain a reduction in the electric current detection accuracy, which is due to the temperature difference between the output MOS transistor and the sense MOS transistor. Inasmuch as it is not necessary to dispose the sense MOS transistor within the array of the output MOS transistor, the limitation on the layout of the sense MOS transistor is eased.

MODES FOR CARRYING OUT THE INVENTION

Modes for carrying out the present invention will hereinafter be described with reference to the drawings.

Embodiment 1

Figure 1:
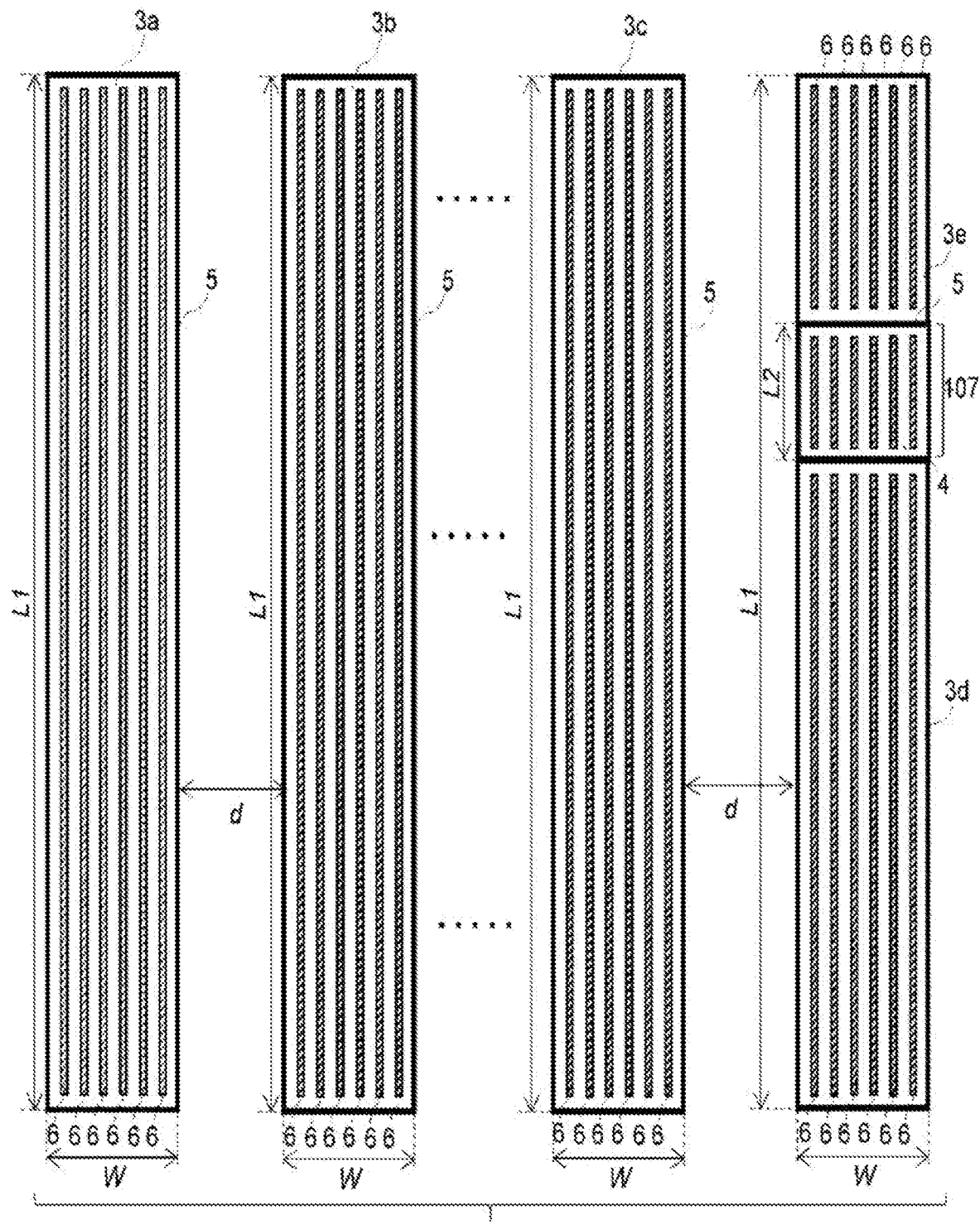
FIG. 1 is a plan view of a semiconductor device according to Embodiment 1.

FIG. 1 is a plan view of a semiconductor device according to Embodiment 1. The semiconductor device according to Embodiment 1 is a semiconductor device for controlling an electric current which implements a function to output a controlled electric current to an external load (not shown) by forming semiconductor elements on a semiconductor chip. The semiconductor device has an output MOS transistor 106 and a sense MOS transistor 107.

The output MOS transistor 106 has a plurality of output transistor portions 3a, 3b, 3c, 3d, and 3e including sources, gates, and drains formed on a semiconductor chip, and outputs an electric current for driving an external load. The output transistor portions 3a, 3b, 3c, 3d, and 3e may hereinafter be collectively referred to as output transistor portions 3.

The sense MOS transistor 107 has a sense transistor portion 4 including sources, gates, and drains formed on the semiconductor chip, as is the case with the output MOS transistor 106, and detects an electric current output from the output MOS transistor 106. The sense transistor portion 4 has a width that is equal to the transverse widths of the output transistor portions 3a through 3e.

In FIG. 1, of the three electrodes of the output MOS transistor 106 and the sense MOS transistor 107, only gate electrodes 6 are illustrated.

Each of the output transistor portions 3a, 3b, 3c, 3d, and 3e has a multi-finger MOS transistor. The multi-finger MOS transistor is a transistor where MOS transistors called a plurality of channels or fingers are connected parallel to each other. Each of the output transistor portions 3a, 3b, 3c, 3d, and 3e may hereinafter be called a first transistor group. In the first transistor group, the plurality of channels are connected by an interconnect layer of the semiconductor chip.

Each of the output transistor portions 3a, 3b, 3c, 3d, and 3e is surrounded by a trench groove 5 with an insulative film embedded therein. The output transistor portions 3 are electrically insulated from outside by the trench grooves 5 and have reduced heat transferred from and to outside. The output transistor portion 3a, for example, has a longitudinal length (longer side length) L1 and a transverse length (shorter side length) W.

The output transistor portions 3a, 3b, 3c, 3d, and 3e have their longitudinal directions parallel to each other and are arrayed in the transverse directions at spaced intervals each represented by a distance d. The distance d is set to a distance large enough to restrain the output transistor portions 3a, 3b, 3c, 3d, and 3e from thermally interfering with each other. The distance d is of a value equal to or larger than the shorter side length W of the output transistor portions 3a, 3b, 3c, 3d, and 3e, for example. Specifically, the distance d is of a value of 50 µm, for example.

The sense transistor portion 4 has a multi-finger MOS transistor as is the case with the output transistor portions 3. The multi-finger MOS transistor of the sense transistor portion 4 has the same channel pitch as the multi-finger MOS transistor of the output transistor portions 3. Specifically, the multi-finger MOS transistor of the sense transistor portion 4 is of the same unit structure as the multi-finger MOS transistor of the output transistor portions 3. The sense transistor portion 4 may hereinafter be called a second transistor group. In the second transistor group, the plurality of channels are connected by an interconnect layer of the semiconductor chip.

As with the output transistor portions 3, the sense transistor portion 4 is surrounded by a trench groove 5 with an insulative film embedded therein. The sense transistor portion 4 is electrically insulated from outside by the trench grooves 5 and have reduced heat transferred from and to outside.

The sense transistor portion 4 has the same width as the shorter side length W of the output transistor portions 3, and is disposed adjacent to the output transistor portions 3 in widthwise alignment therewith. For example, the sense transistor portion 4 is disposed adjacent to the output transistor portions 3d and 3e that are part of the plurality of output transistor portions 3.

The shorter side length W of the output transistor portions 3 described above is preferably be as small as possible compared with the longer side length L1. For example, the shorter side length W is set to at least ⅕ of the longer side length L1 or less. This is to aim at increasing the peripheral length with respect to the area of the output transistor portions 3 to increase the amount of heat radiated in shorter side directions for thereby smoothing the temperature distribution in the shorter side directions while suppressing the temperature of the output transistor portions 3, thus reducing the temperature difference between the output MOS transistor 106 and the sense MOS transistor 107. Furthermore, since the length L2 of the sense MOS transistor designed at a certain sense ratio can be increased by reducing the shorter side length W with respect to the longer side length L1, the temperature difference between the output MOS transistor 106 and the sense MOS transistor 107 can be reduced.

Figure 2:
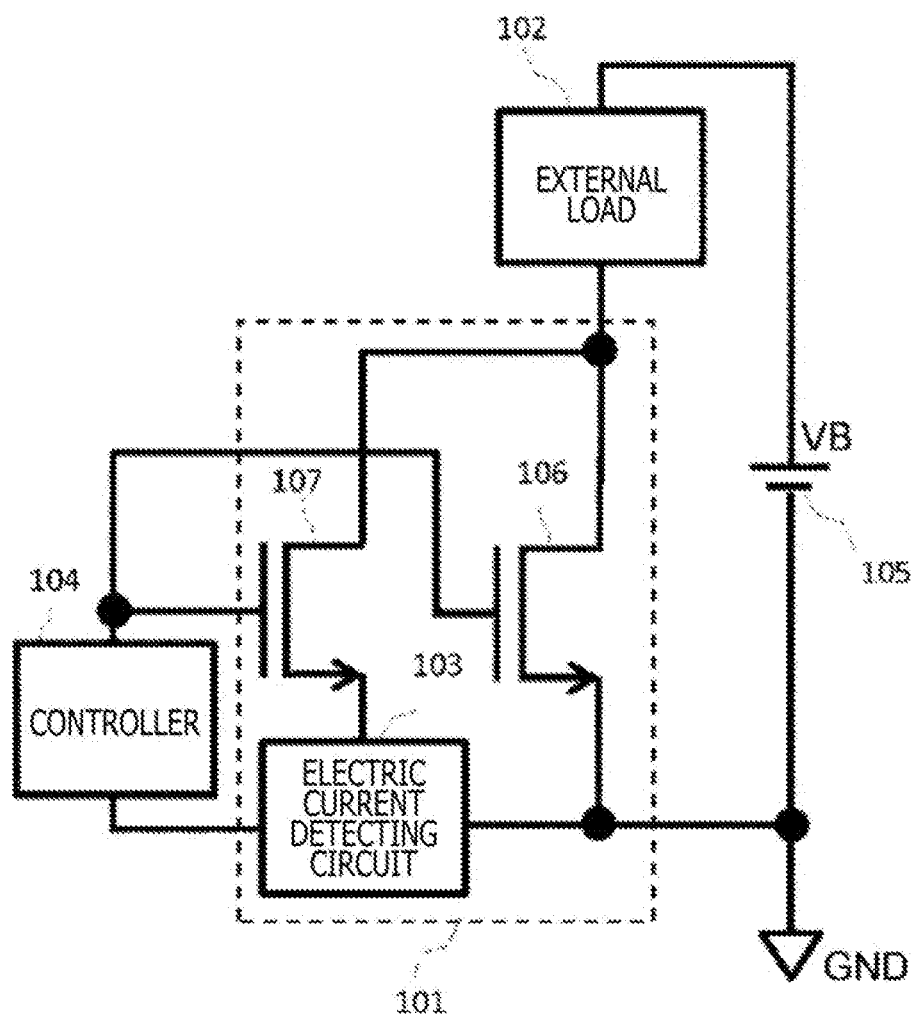
FIG. 2 is a circuit diagram of an electric current drive circuit including the semiconductor device according to Embodiment 1.

FIG. 2 is a circuit diagram of an electric current drive circuit including the semiconductor device according to Embodiment 1. Referring to FIG. 2, the drain of the sense MOS transistor 107 and the drain of the output MOS transistor 106 are connected in common to one terminal of an external load 102. The other terminal of the external load 102 is connected to a positive pole (power supply potential VB) of a power supply 105.

The power supply 105 has a negative pole connected to GND (ground potential). The gate of the sense MOS transistor 107 and the gate of the output MOS transistor 106 are connected in common to an electric current control terminal of a controller 104. The electric current control terminal is a terminal for outputting a control signal with which the controller 104 controls an electric current flowing through the external load 102. The source of the output MOS transistor 106 is connected to GND. The source of the sense MOS transistor 107 is connected to an electric current detecting circuit 103.

The electric current detecting circuit 103 is a circuit for detecting an electric current flowing through the sense MOS transistor 107 thereby to indirectly detect an electric current flowing through the output MOS transistor 106. The electric current value of the sense MOS transistor 107 with respect to the electric current value of the output MOS transistor 106 is referred to as a sense ratio. An energy loss that is caused by the electric current detecting circuit 103 is reduced by setting the sense ratio to a small value. The electric current flowing through the output MOS transistor 106 is substantially equal to an electric current flowing through the external load 102.

In the electric current detecting circuit 103, the source of the sense MOS transistor 107 is maintained at the same potential as the source of the output MOS transistor 106 using an operational amplifier (not shown). In other words, the source of the sense MOS transistor 107 and the source of the output MOS transistor 106 are in an imaginary short-circuit state. The imaginary short-circuit state refers to a state in which two or more electrodes are kept at the same potential though they are not directly connected to each other. The electric current detecting circuit 103 employs a current mirror circuit (not shown), for example, for generating an electric current detection signal to be input to the controller 104 from a weak electric current flowing through the sense MOS transistor 107. The electric current detecting circuit 103 inputs the electric current detection signal that represents a detected current value to the controller 104. The controller 104 controls an electric current to flow through the external load 102 while referring to the electric current value indicated by the electric current detection signal input thereto. Therefore, it is necessary to detect an electric current with high accuracy in order to control an electric current with high accuracy.

As described above, as illustrated in FIG. 2, the output MOS transistor 106 and the sense MOS transistor 107 have their drains connected to the external load 102 and their gates connected to the controller 104. On the other hand, the source of the output MOS transistor 106 is connected to GND (ground potential), and the source of the sense MOS transistor 107 is connected to GND through the electric current detecting circuit 103. The source of the output MOS transistor 106 and the source of the sense MOS transistor 107 are kept in an imaginary short-circuit state by the electric current detecting circuit 103.

Since the output MOS transistor 106 and the sense MOS transistor 107 are made up of multi-finger MOS transistors having the same channel pitch, the amounts of electric power consumed by their transistors per unit area are equal to each other and their heat generation densities are also equal to each other.

Furthermore, as the longer side length L1 of the output transistor portions 3 is larger than the shorter side length W thereof, as illustrated in FIG. 1, the longitudinal ends of the output MOS transistor 106 and the sense MOS transistor 107 have a relatively small effect on the heat radiation from the heat radiation from the output MOS transistor 106 and the sense MOS transistor 107 into a peripheral area. As a result, the temperature distribution in the output transistor portions 3 is substantially uniform in their longitudinal directions except the longitudinal ends thereof. Therefore, with the sense transistor portion 4 disposed to replace an intermediate portion in the longitudinal direction of one of the output transistor portions 3, as illustrated in FIG. 1, the temperature distribution in the transverse directions of the output MOS transistor 106 is substantially equal to that of the sense MOS transistor 107. As a consequence, changes caused in the sense ratio due to the output MOS transistor 106 and the sense MOS transistor 107 generating heat by themselves are restrained.

Moreover, as illustrated in FIG. 1, the sense transistor portion 4 may be disposed in longitudinal alignment with output transistor portions 3d and 3e that are disposed on an outermost side of the plurality of output transistor portions 3. As a result, the regularity of the layout of interconnects of the output MOS transistor 106 is restrained from being disturbed by interconnects that lead outwardly from the source electrodes of the sense MOS transistor 107.

Furthermore, the output MOS transistor 106 and the sense MOS transistor 107 constitute an LDMOS (Lateral Diffused MOS) transistor. LDMOS transistors can have a high withstand voltage of 40 V or higher. Generally, insofar as LDMOS transistors are concerned, when a sense MOS transistor is embedded in an output MOS transistor array, the sense MOS transistor and the drain or source of the output MOS transistor are electrically connected to each other on a semiconductor chip.

However, as the sense MOS transistor and the drain or source of the output MOS transistor are electrically connected to each other on the semiconductor chip, the degree of freedom of their circuit arrangement as a semiconductor device for controlling an electric current is lowered. In a semiconductor device for controlling an electric current, since an electric current detecting circuit (the electric current detecting circuit 103 in FIG. 2) is disposed between the drain (or source) of a main MOS transistor and the drain (or source) of a sense MOS transistor, the drain (or source) of a sense MOS transistor and the drain (or source) of an output MOS transistor that are electrically connected to each other are disadvantageous. Consequently, with an arrangement in which the drain of an output MOS transistor and the drain of a sense MOS transistor are electrically connected to each other, an electric current detecting circuit has to be disposed between the source of the output MOS transistor and the source of the sense MOS transistor. Similarly, with an arrangement in which the source of an output MOS transistor and the source of a sense MOS transistor are electrically connected to each other, an electric current detecting circuit has to be disposed between the drain of the output MOS transistor and the drain of the sense MOS transistor. The degree of freedom of the circuit arrangement is thus lowered.

According to the present embodiment, as illustrated in FIG. 1, inasmuch as the sense transistor portion 4 and the output transistor portions 3 are surrounded respectively by the trench grooves 5, the sense MOS transistor 107 and the output MOS transistor 106 are electrically separated from each other on the semiconductor chip. Therefore, the degree of freedom of the arrangement of the electric current drive circuit is increased.

Figure 3:
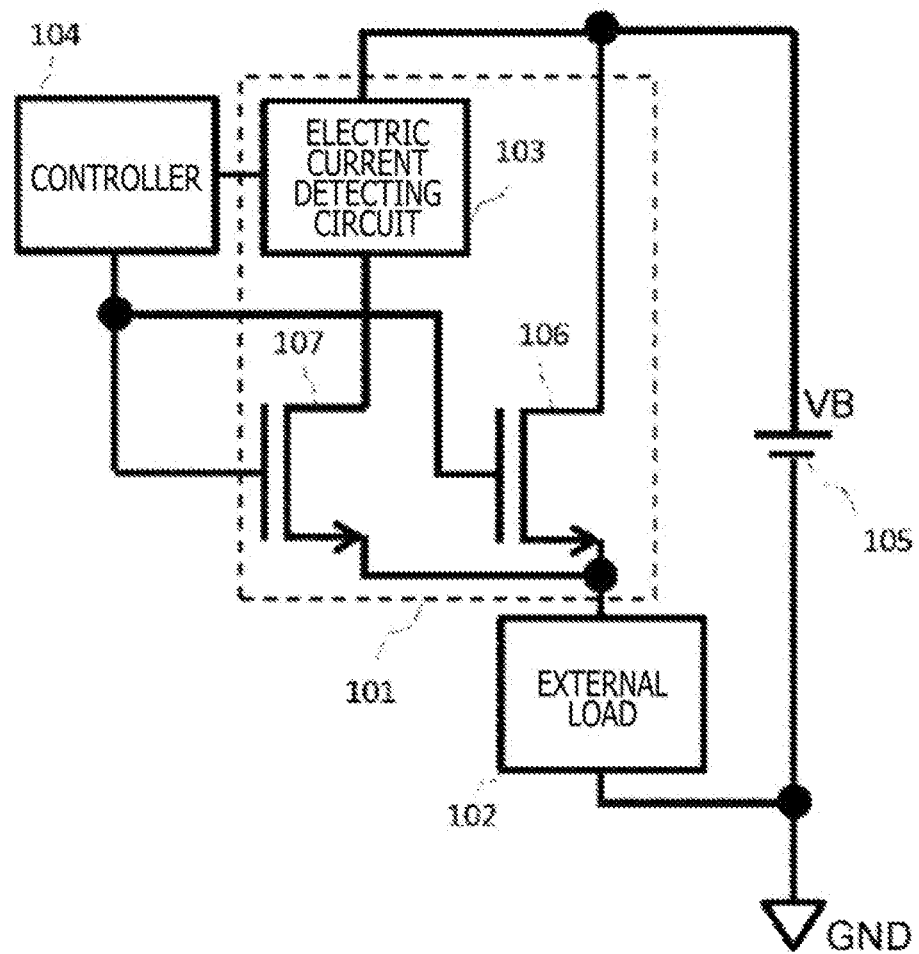
FIG. 3 is a circuit diagram of an electric current drive circuit according to another example including the semiconductor device according to Embodiment 1.

FIG. 3 is a circuit diagram of an electric current drive circuit according to another example, including the semiconductor device according to Embodiment 1. The electric current drive circuit illustrated in FIG. 2 is a circuit of such an arrangement that the drain of the output MOS transistor 106 and the drain of the sense MOS transistor 107 are connected in common (short-circuited), and the source of the output MOS transistor 106 and the source of the sense MOS transistor 107 are kept at the same potential (imaginary short-circuited). On the other hand, the electric current detecting circuit illustrated in FIG. 3 is a circuit of such an arrangement that the source of the output MOS transistor 106 and the source of the sense MOS transistor 107 are connected in common (short-circuited), and the drain of the output MOS transistor 106 and the drain of the sense MOS transistor 107 are kept at the same potential (imaginary short-circuited).

Referring to FIG. 3, the source of the output MOS transistor 106 and the source of the sense MOS transistor 107 are connected in common to one terminal of the external load 102. The other terminal of the external load 102 is connected to GND. The gate of the sense MOS transistor 107 and the gate of the output MOS transistor 106 are connected in common to an electric current control terminal of the controller 104. The electric current control terminal is a terminal for outputting a control signal with which the controller 104 controls an electric current flowing through the external load 102. The drain of the output MOS transistor 106 is connected to a positive pole (power supply potential VB) of the power supply 105. The negative pole of the power supply 105 is connected to GND (ground potential). The drain of the sense MOS transistor 107 is connected to the electric current detecting circuit 103.

The electric current detecting circuit 103 is a circuit for detecting an electric current flowing through the sense MOS transistor 107 thereby to indirectly detect an electric current flowing through the output MOS transistor 106. An energy loss that is caused by the electric current detecting circuit 103 is reduced by setting a sense ratio that represents the electric current value of the sense MOS transistor 107 with respect to the electric current value of the output MOS transistor 106, to a small value. The electric current flowing through the output MOS transistor 106 is substantially equal to an electric current flowing through the external load 102.

In the electric current detecting circuit 103, the drain of the sense MOS transistor 107 is maintained at the same potential as the drain of the output MOS transistor 106 using an operational amplifier (not shown). In other words, the drain of the sense MOS transistor 107 and the drain of the output MOS transistor 106 are in an imaginary short-circuit state. The electric current detecting circuit 103 employs a current mirror circuit (not shown), for example, for generating an electric current detection signal to be input to the controller 104 from a weak electric current flowing through the sense MOS transistor 107. The electric current detecting circuit 103 inputs the electric current detection signal that represents a detected current value to the controller 104. The controller 104 controls an electric current to flow through the external load 102 while referring to the electric current value indicated by the electric current detection signal input thereto.

The electric current drive circuit according to Embodiment 1 illustrated in FIG. 2 employs an example of circuit in which the source of the output MOS transistor 106 is connected to the ground potential, the source of the sense MOS transistor 107 is connected to the electric current detecting circuit 103, and the source of the output MOS transistor 106 and the source of the sense MOS transistor 107 are in the imaginary short-circuit state. However, since the degree of freedom of the electric current drive circuit is increased by electrically separating the sense MOS transistor 107 and the output MOS transistor 106 from each other, it is possible, as is the case with the example of circuit according to the other example illustrated in FIG. 3, to construct an electric current drive circuit in which the drain of the output MOS transistor 106 is connected to the power supply potential, the drain of the sense MOS transistor 107 is connected to the electric current detecting circuit 103, and the drain of the output MOS transistor 106 and the drain of the sense MOS transistor 107 are in the imaginary short-circuit state.

According to the present embodiment, as described above, the semiconductor device has the output MOS transistor 106 that has the output transistor portions 3 including sources, gates, and drains formed on a semiconductor chip, and that outputs an electric current for driving the external load 102, and the sense MOS transistor 107 that has the sense transistor portion 4 including sources, gates, and drains formed on the semiconductor chip, and having a width equal to the transverse widths of the output transistor portions 3, and that detects the electric current output from the output MOS transistor 106. Therefore, since the output transistor portions 3 and the sense transistor portion 4 have the same width, it is possible to restrain a reduction in the electric current detection accuracy, which is due to the temperature difference between the output MOS transistor 106 and the sense MOS transistor 107. Moreover, inasmuch as it is not necessary to dispose the sense MOS transistor 107 within the array of the output MOS transistor 106, the limitation on the layout of the sense MOS transistor 107 is eased.

Moreover, the sense transistor portion 4 is disposed longitudinally in line with one of the output transistor portions 3 such that the transverse side of the output transistor portion 3 and the side of the sense transistor portion 4 that has the same width as the transverse width of the output transistor portion 3 are adjacent to each other. Therefore, since the output transistor portion 3 and the sense transistor portion 4 are linearly arranged in widthwise alignment with each other, the temperature distributions of the output transistor portion 3 and the sense transistor portion 4 are brought closely to each other for restraining a reduction in the electric current detection accuracy.

In addition, the sense MOS transistor 107 has the same unit structure as the output MOS transistor 106. Since the output MOS transistor 106 and the sense MOS transistor 107 have the same unit structure, the electric power densities that they develop on their own and the electric power densities that they are given from outside are of approximately the same extent each, thereby restraining the output MOS transistor 106 and the sense MOS transistor 107 from developing a temperature difference.

Furthermore, the output transistor portions 3 are available as plural output transistor portions, and the sense transistor portion 4 is disposed such that the side of the sense transistor portion 4 that has the same width as the transverse width of the output transistor portions 3 is adjacent to the transverse side of either one of the output transistor portions 3*d* and 3*e*. As there are the plural output transistor portions 3 and the sense transistor portion 4 is arrayed longitudinally in line with either one of the output transistor portions 3, the output transistor portion 3 is restrained from being too long in the longitudinal directions, and the transverse electric power densities of the output MOS transistor 106 and the sense MOS transistor 107 are of approximately the same extent, restraining them from developing a temperature difference.

The output transistor portions 3 have their longitudinal directions parallel to each other and are arrayed in the transverse directions, and the sense transistor portion 4 is disposed adjacent longitudinally to the output transistor portions 3*d* and 3*e* that are dispose on a transversely outermost side. As the sense transistor portion 4 is disposed on the transversely outermost side, the interconnect layout of the output MOS transistor 106 is restrained from being limited by the interconnect layout of the sense MOS transistor 107.

Furthermore, each of the output transistor portions 3 and the sense transistor portion 4 has its four sides surrounded by the trench groove 5 that is electrically insulative heat insulator. As the output transistor portions 3 and the sense transistor portion 4 are surrounded and isolated by the respective heat insulators, they are restrained from thermally affecting each other. Moreover, the output MOS transistor 106 and the sense MOS transistor 107 are electrically separated from each other. The electric separation of the output MOS transistor 106 and the sense MOS transistor 107 increases the degree of freedom of the arrangement of the electric current drive circuit.

Moreover, the two output transistor portions 3 are arrayed longitudinally in sandwiching relation to the sense transistor portion 4 such that the transverse sides of the output transistor portions 3 and the sides of the sense transistor portion 4 that have the same width as the transverse width of the output transistor portions 3 are adjacent to each other. Because the output transistor portions 3 sandwich the sense transistor portion 4 therebetween, the internal temperatures of the sense transistor portion 4 and the output transistor portions 3 are restrained from being different from each other.

Furthermore, the transverse length of the output transistor portions 3 is equal to or smaller than ⅕ of the longitudinal length thereof. As the longitudinal length of the output transistor portions 3 is equal to or larger than five times the transverse length thereof, the output transistor portions 3 have a sufficiently long longitudinally uniform temperature distribution.

Furthermore, the output MOS transistor 106 and the sense MOS transistor 107 constitute a Lateral Diffused MOS transistor. In an arrangement that employs high-withstand-voltage MOS transistors where the drains or sources of the sense MOS transistor 107 and the output MOS transistor 106 are electrically connected on a semiconductor chip, it is possible to restrain a reduction in the electric current detection accuracy, which is due to a temperature difference between the output MOS transistor 106 and the sense MOS transistor 107.

Embodiment 2

The semiconductor device according to Embodiment 1 is arranged such that the sense transistor portion 4 is sandwiched between the two output transistor portions 3d and 3e. However, the present invention is not limited such details. According to Embodiment 2, there is illustrated a semiconductor device arranged such that a sense transistor portion 4 is adjacent to only one output transistor portion.

Figure 4:
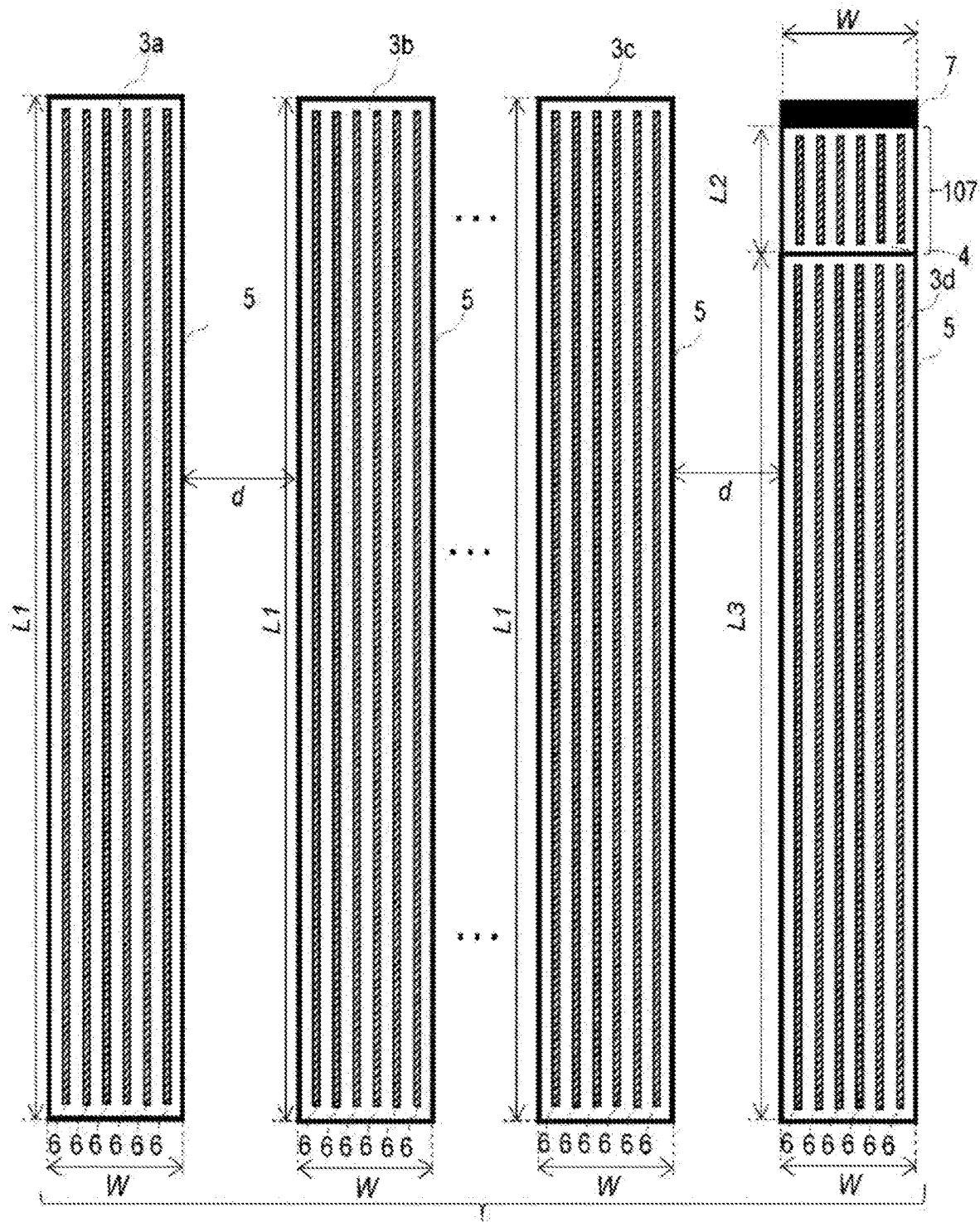
FIG. 4 is a plan view of a semiconductor device according to Embodiment 2.

FIG. 4 is a plan view of a semiconductor device according to Embodiment 2. A circuit diagram of an electric current drive circuit according to Embodiment 2 is similar to the circuit diagram illustrated in FIG. 2 according to Embodiment 1.

Referring to FIG. 4, the semiconductor device according to Embodiment 2 is different from the semiconductor device according to Embodiment 1 in that the sense transistor portion 4 of the sense MOS transistor 107 is adjacent on only one side to one 3d of the output transistor portions 3a, 3b, 3c, and 3d of the output MOS transistor 106. Consequently, the output transistor portion 3e illustrated in FIG. 1 is dispensed with, and the output transistor portion 3d has a longer side length increased to L3.

Furthermore, the semiconductor device according to Embodiment 2 is also different from the semiconductor device according to Embodiment 1 in that the sense transistor portion 4 has, on a side thereof opposite the side adjacent to the output transistor portion 3d, a trench groove 7 having a larger heat resistance than the trench groove 5 on the other sides. Since the heat resistance of the trench groove 7 is larger than the heat resistance of the trench groove 5, heat generated by the sense MOS transistor 107 is restrained from being radiated from the trench groove 7. With this arrangement, the difference between the internal temperatures of the output MOS transistor 106 and the sense MOS transistor 107 is restrained from increasing, reducing the dependency of the sense ratio on the drive current, while at the same time the sense transistor portion 4 can be disposed at a corner of the entire transistor assembly including the sense transistor portion 4 and the output transistor portions 3. As a result, the regularity of the interconnect layout of the output MOS transistor 106 is increased furthermore.

According to the present embodiment, as described above, one of the output transistor portions 3 and the sense transistor portion 4 are arranged in a longitudinal array such that the transverse side of the output transistor portion 3 and the side of the sense transistor portion that has the same width as the transverse width of the output transistor portion are adjacent to each other, and, of the heat insulators on the four sides of the sense transistor portion 4, the trench groove 7 that is the heat insulator on the side opposite the side adjacent to the output transistor portion 3 has the larger heat resistance than the heat insulator (the trench groove 5) on the other sides. More heat is restrained from being radiated from the side of the sense transistor portion 4 opposite the side adjacent to the output transistor portion 3, thereby restraining the internal temperatures of the sense transistor portion 4 and the output transistor portions 3 from being different from each other.

Embodiment 3

According to Embodiment 1, the semiconductor device is illustrated that is employed in the electric current drive circuit that causes a positive electric current to flow through the external load 102, as illustrated in FIG. 2 or 3. According to Embodiment 3, a semiconductor device is illustrated that is employed in an electric current drive circuit that causes a positive (high side) and a negative (low side) electric current to flow through an external load. Consequently, the semiconductor device according to the present embodiment includes an output MOS transistor and a sense MOS transistor for a high-side electric current and an output MOS transistor and a sense MOS transistor for a low-side electric current.

Figure 5:
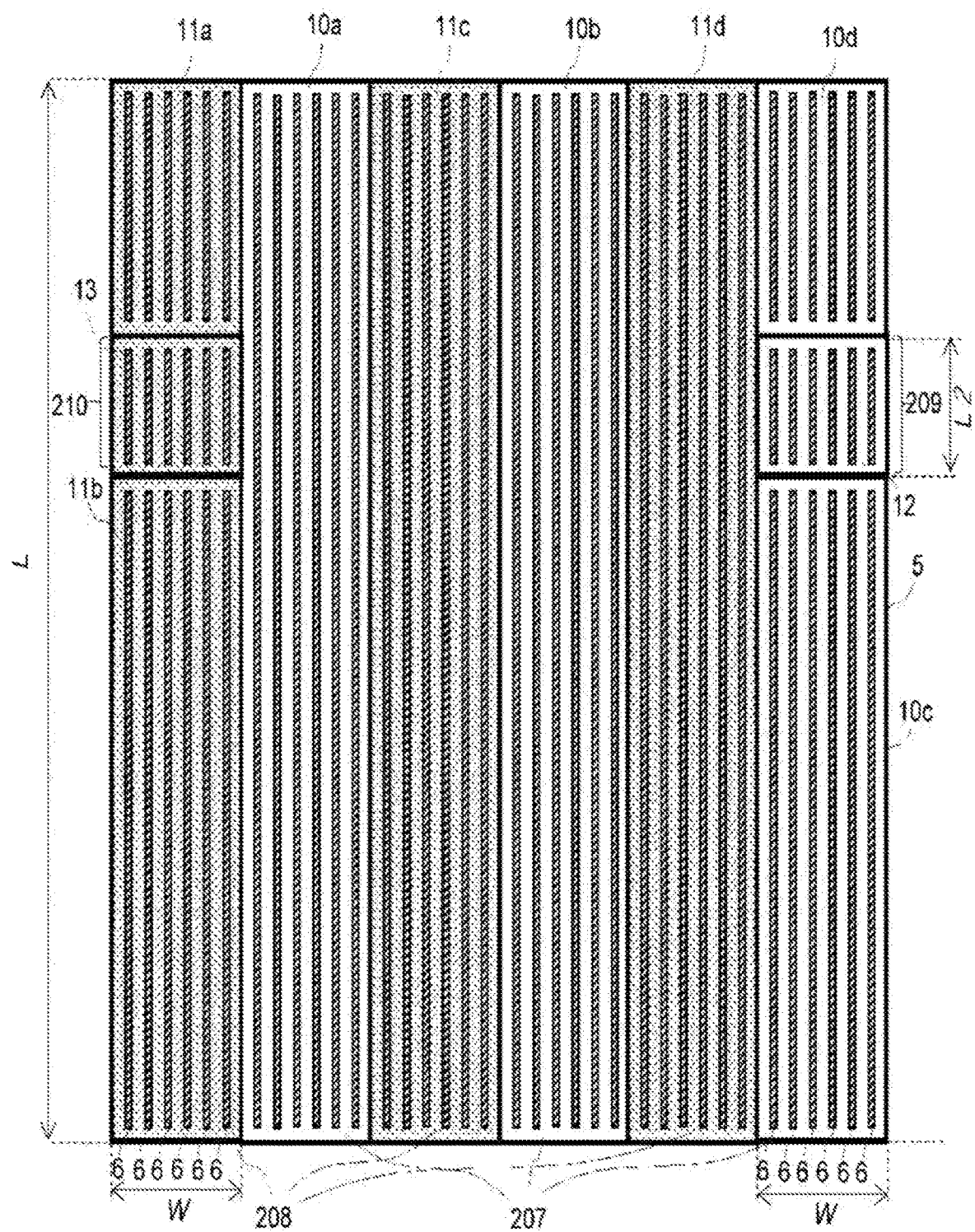
FIG. 5 is a plan view of a semiconductor device according to Embodiment 3.

FIG. 5 is a plan view of a semiconductor device according to Embodiment 3. The semiconductor device includes a low-side output MOS transistor 207, a low-side sense MOS transistor 209, a high-side output MOS transistor 208, and a high-side sense MOS transistor 210. The low-side MOS transistors, i.e., the low-side output MOS transistor 207 and the low-side sense MOS transistor 209, are of similar structures to the output MOS transistor 106 and the sense MOS transistor 107 according to Embodiment 1 illustrated in FIG. 1. The high-side MOS transistors, i.e., the high-side output MOS transistor 208 and the high-side sense MOS transistor 210, are also of similar structures to the output MOS transistor 106 and the sense MOS transistor 107 according to Embodiment 1 illustrated in FIG. 1.

The low-side output MOS transistor 207 has a plurality of low-side output transistor portions 10a, 10b, 10c, and 10d including sources, gates, and drains formed on a semiconductor chip, and outputs an electric current for driving an external load. The low-side output transistor portions 10a, 10b, 10c, and 10d may hereinafter be collectively referred to as low-side output transistor portions 10.

The low-side sense MOS transistor 209 has a low-side sense transistor portion 12 including sources, gates, and drains formed on a semiconductor chip, as is the case with the low-side output MOS transistor 207, and detects an electric current output from the low-side output MOS transistor 207. The low-side sense transistor portion 12 has a width W that is equal to the transverse widths of the low-side output transistor portions 10a through 10d.

The high-side output MOS transistor 208 has a plurality of high-side output transistor portions 11a, 11b, 11c, and 11d including sources, gates, and drains formed on a semiconductor chip, and outputs an electric current for driving the external load. The high-side output transistor portions 11a, 11b, 11c, and 11d may hereinafter be collectively referred to as high-side output transistor portions 11.

The high-side sense MOS transistor 210 has a high-side sense transistor portion 13 including sources, gates, and drains formed on a semiconductor chip, as is the case with the high-side output MOS transistor 208, and detects an electric current output from the high-side output MOS transistor 208. The high-side sense transistor portion 13 has a width W that is equal to the transverse widths of the high-side output transistor portions 11a through 11d.

In FIG. 5, of the three electrodes of the low-side output MOS transistor 207, the low-side sense MOS transistor 209, the high-side output MOS transistor 208, and the high-side sense MOS transistor 210, only gate electrodes 6 are illustrated.

According to the present embodiment, furthermore, the low-side output transistor portions (third transistor group) 10a, 10b, 10c, and 10d of the low-side output MOS transistor 207 and the high-side output transistor portions (fourth transistor group) 11a, 11b, 11c, and 11d of the high-side output MOS transistor 208 are alternately disposed so as to fill each other's spaced intervals. With respect to either one of the groups, the distance d according to Embodiment 1 and the width W are equal to each other. According to the present embodiment, since the low-side output transistor portions 10 and the high-side output transistor portions 11 are disposed with no gaps therebetween, the chip area of the output MOS transistor can efficiently be utilized.

Figure 6:
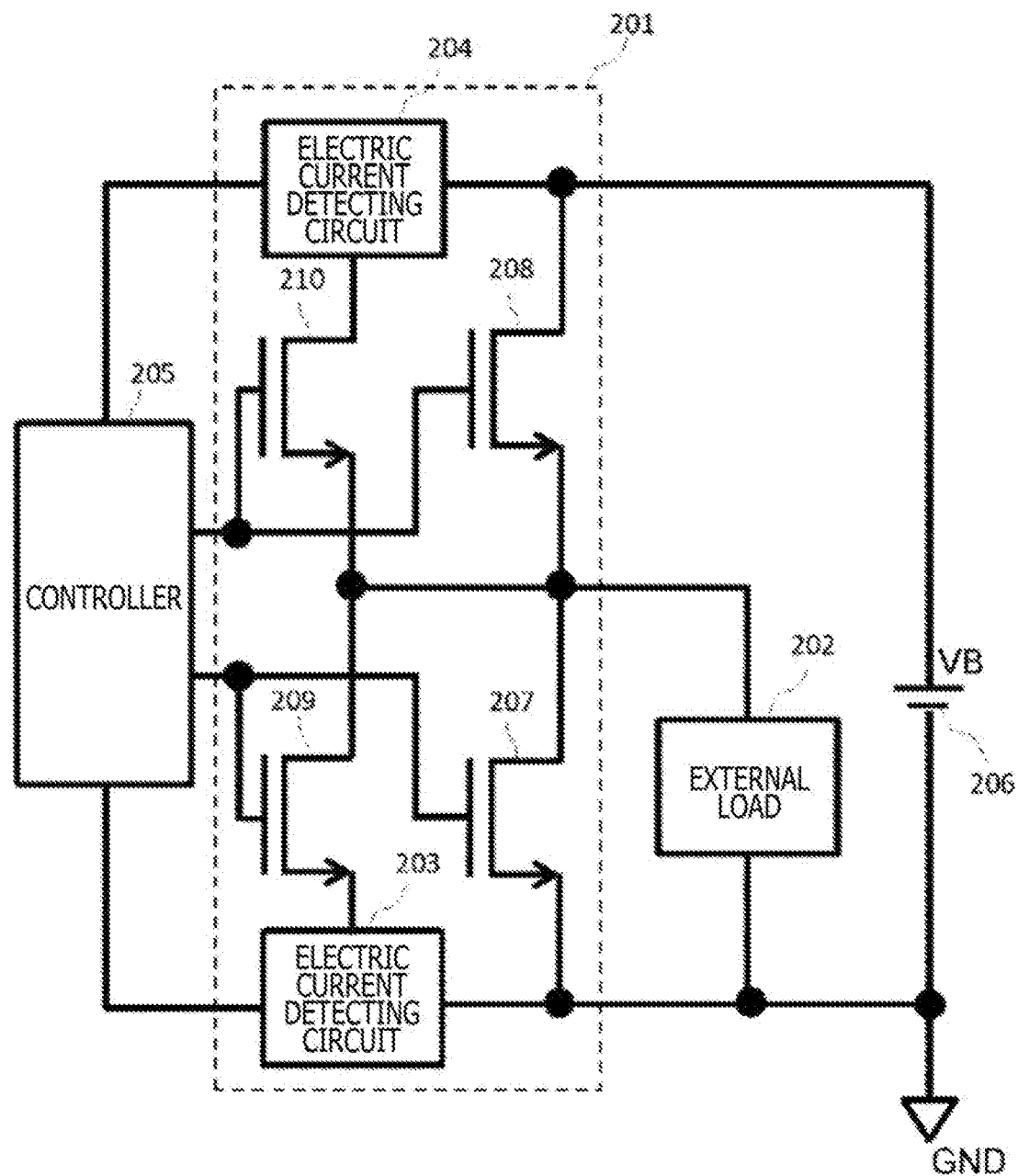
FIG. 6 is a circuit diagram of an electric current drive circuit including the semiconductor device according to Embodiment 3.

FIG. 6 is a circuit diagram of an electric current drive circuit including the semiconductor device according to Embodiment 3. Referring to FIG. 6, the drain of the low-side sense MOS transistor 209 and the drain of the low-side output MOS transistor 207 are connected in common to one terminal of an external load 202. The other terminal of the external load 202 is connected to GND (ground potential).

The gate of the low-side sense MOS transistor 209 and the gate of the low-side output MOS transistor 207 are connected in common to a low-side electric current control terminal of a controller 205. The low-side electric current control terminal is a terminal for outputting a low-side control signal with which the controller 205 controls an electric current flowing through the external load 202. The source of the low-side output MOS transistor 207 is connected to GND. The source of the low-side sense MOS transistor 209 is connected to a low-side electric current detecting circuit 203.

The low-side electric current detecting circuit 203 is a circuit for detecting an electric current flowing through the low-side sense MOS transistor 209 thereby to indirectly detect an electric current flowing through the low-side output MOS transistor 207. An energy loss that is caused by the electric current detecting circuit 203 is reduced by setting a sense ratio that represents the electric current value of the low-side sense MOS transistor 209 with respect to the electric current value of the low-side output MOS transistor 207, to a small value. While the high-side output MOS transistor 208 to be described later is off, the electric current flowing through the low-side output MOS transistor 207 is substantially equal to a negative electric current flowing through the external load 202.

In the low-side electric current detecting circuit 203, the source of the low-side sense MOS transistor 209 is maintained at the same potential as the source of the low-side output MOS transistor 207 using an operational amplifier (not shown). In other words, the source of the low-side sense MOS transistor 209 and the source of the low-side output MOS transistor 207 are in an imaginary short-circuit state. The low-side electric current detecting circuit 203 employs a current mirror circuit (not shown), for example, for generating a low-side electric current detection signal to be input to the controller 205 from a weak electric current flowing through the low-side sense MOS transistor 209. The low-side electric current detecting circuit 203 inputs the low-side electric current detection signal that represents a detected current value to the controller 205. The controller 205 controls a negative electric current to flow through the external load 202 while referring to the electric current value indicated by the low-side electric current detection signal input thereto. When the negative electric current is to flow through the external load 202, the controller 205 turns off the high-side output MOS transistor 208 to be described later.

The source of the high-side sense MOS transistor 210 and the source of the high-side output MOS transistor 208 are connected in common to the terminal of the external load 202 to which the drain of the low-side sense MOS transistor 209 and the drain of the low-side output MOS transistor 207 are connected.

The gate of the high-side sense MOS transistor 210 and the gate of the high-side output MOS transistor 208 are connected in common to a high-side electric current control terminal of the controller 205. The high-side electric current control terminal is a terminal for outputting a high-side control signal with which the controller 205 controls an electric current flowing through the external load 202. The drain of the high-side output MOS transistor 208 is connected to a positive pole (power supply potential VB) of a power supply 206. The power supply 206 has a negative pole connected to GND (ground potential). The drain of the high-side sense MOS transistor 210 is connected to a high-side electric current detecting circuit 204.

The high-side electric current detecting circuit 204 is a circuit for detecting an electric current flowing through the high-side sense MOS transistor 210 thereby to indirectly detect an electric current flowing through the high-side output MOS transistor 208. An energy loss that is caused by the high-side electric current detecting circuit 204 is reduced by setting a sense ratio that represents the electric current value of the high-side sense MOS transistor 210 with respect to the electric current value of the high-side output MOS transistor 208, to a small value. The electric current flowing through the high-side output MOS transistor 208 is substantially equal to a positive electric current flowing through the external load 202.

In the high-side electric current detecting circuit 204, the drain of the high-side sense MOS transistor 210 is maintained at the same potential as the drain of the high-side output MOS transistor 208 using an operational amplifier (not shown). In other words, the drain of the high-side sense MOS transistor 210 and the drain of the high-side output MOS transistor 208 are in an imaginary short-circuit state. The high-side electric current detecting circuit 204 employs a current mirror circuit (not shown), for example, for generating a high-side electric current detection signal to be input to the controller 205 from a weak electric current flowing through the high-side sense MOS transistor 210. The high-side electric current detecting circuit 204 inputs the high-side electric current detection signal that represents a detected electric current value to the controller 205. The controller 205 controls a positive electric current to flow through the external load 202 while referring to the electric current value indicated by the electric current detection signal input thereto. When the positive electric current is to flow through the external load 202, the controller 205 turns off the low-side output MOS transistor 207 described above.

As described above, the electric current drive circuit according to Embodiment 3 illustrated in FIG. 6 includes the low-side output MOS transistor 207 connected to the ground potential GND and the high-side output MOS transistor 208 connected to the power supply voltage VB, both of the transistors being connected to the external load 202. For causing an electric current to flow to the external load 202, the high-side output MOS transistor 208 is turned on and the low-side output MOS transistor 207 is turned off. For causing an electric current to flow from the external load 202, the low-side output MOS transistor 207 is turned on and the high-side output MOS transistor 208 is turned off. Both of the transistors are not simultaneously turned on. Therefore, while one of the MOS transistors is generating heat, the other MOS transistor does not generate heat.

According to the present embodiment, therefore, since the low-side output transistor portions (third transistor group) 10a, 10b, 10c, and 10d of the low-side output MOS transistor 207 are put in substantially the same environment, the internal temperatures of those transistors are substantially equal to each other. Furthermore, the internal temperature of the transistors of the low-side sense transistor portion (fifth transistor group) of the low-side sense MOS transistor 209 that is disposed adjacent to the low-side output transistor portions 10c and 10d is substantially equal to the internal temperatures of the transistors of the low-side output transistor portions 10.

According to the present embodiment, similarly, since the high-side output transistor portions (fourth transistor group) 11a, 11b, 11c, and 11d of the high-side output MOS transistor 208 are put in substantially the same environment, the internal temperatures of those transistors are substantially equal to each other. Furthermore, the internal temperature of the transistors of the high-side sense transistor portion (sixth transistor group) 13 of the high-side sense MOS transistor 210 that is disposed adjacent to the high-side output transistor portions 11a and 11b is substantially equal to the internal temperatures of the transistors of the high-side output transistor portions 11.

As described above, the internal temperatures of the high-side output MOS transistor 208 and the high-side sense MOS transistor 210 are substantially equal to each other. With this arrangement, as the sense MOS transistors 209 and 210 can be disposed at the transverse ends of the output MOS transistors 207 and 208 while reducing the dependency of the sense ratio on the drive current, the regularity of the interconnect layouts of the output MOS transistors 207 and 208 is increased furthermore.

According to the present embodiment, as described above, the output transistor portions 10 (or 11) are arrayed in the transverse directions at spaced intervals equal to or larger than the transverse width W. Inasmuch as the output transistor portions 10 (or 11) are disposed in the transverse directions at the spaced intervals d equal to or larger than the width of the channels, the effect of heat applied mutually to the MOS transistors is sufficiently reduced, restraining the output MOS transistor 207 (or 208) and the sense MOS transistor 209 (or 210) from developing a temperature difference. According to the present embodiment, d=W. However, the effect of heat is further reduced if d>W.

The semiconductor device has, as the output transistor portions: the plurality of high-side output transistor portions 11 that have the high-side output MOS transistor 208 disposed between the power supply potential VB and the external load 202, each of the plurality of high-side output transistor portions being surrounded by the trench grooves 5; and the plurality of low-side output transistor portions 10 that have the low-side output MOS transistor 207 disposed between the external load 202 and the ground potential GND, each of the plurality of low-side output transistor portions being surrounded by the trench grooves 5. The semiconductor device also has, as the sense transistor portions: the high-side sense transistor portion 13 that has the high-side sense MOS transistor 210 for detecting an electric current through the high-side output MOS transistor 208, that has the same width as the transverse width of one of the high-side output transistor portions 11, and that is disposed adjacent to the one of the high-side output transistor portions 11; and the low-side sense transistor portion 12 that has the low-side sense MOS transistor 209 for detecting an electric current through the low-side output MOS transistor 207, that has the same width as the transverse width of one of the low-side output transistor portions 10, and that is disposed adjacent to the one of the low-side output transistor portions 10. The high-side output transistor portions 11 and the low-side output transistor portions 10 are alternately disposed adjacent to each other.

Consequently, the high-side output transistor portions 11 and the low-side output transistor portions 10 are alternately disposed, and when either the high-side output transistor portions 11 or the low-side output transistor portions 10 are turned on, the other output transistor portions are turned off, a high area efficiency is therefore realized, and further, from the standpoint of heat radiation from one of the groups, the other group functions as if providing spaces between the output transistor portions, sufficiently reducing the effect of heat applied mutually to the output transistor portions.

Embodiment 4

According to Embodiment 3, the sense transistor portion is sandwiched between the two output transistor portions with respect to each of high-side and low-side electric currents. However, the present invention is not limited such details. According to Embodiment 4, there is illustrated a semiconductor device arranged such that a sense transistor portion is adjacent to only one output transistor portion with respect to each of high-side and low-side electric currents.

Figure 7:
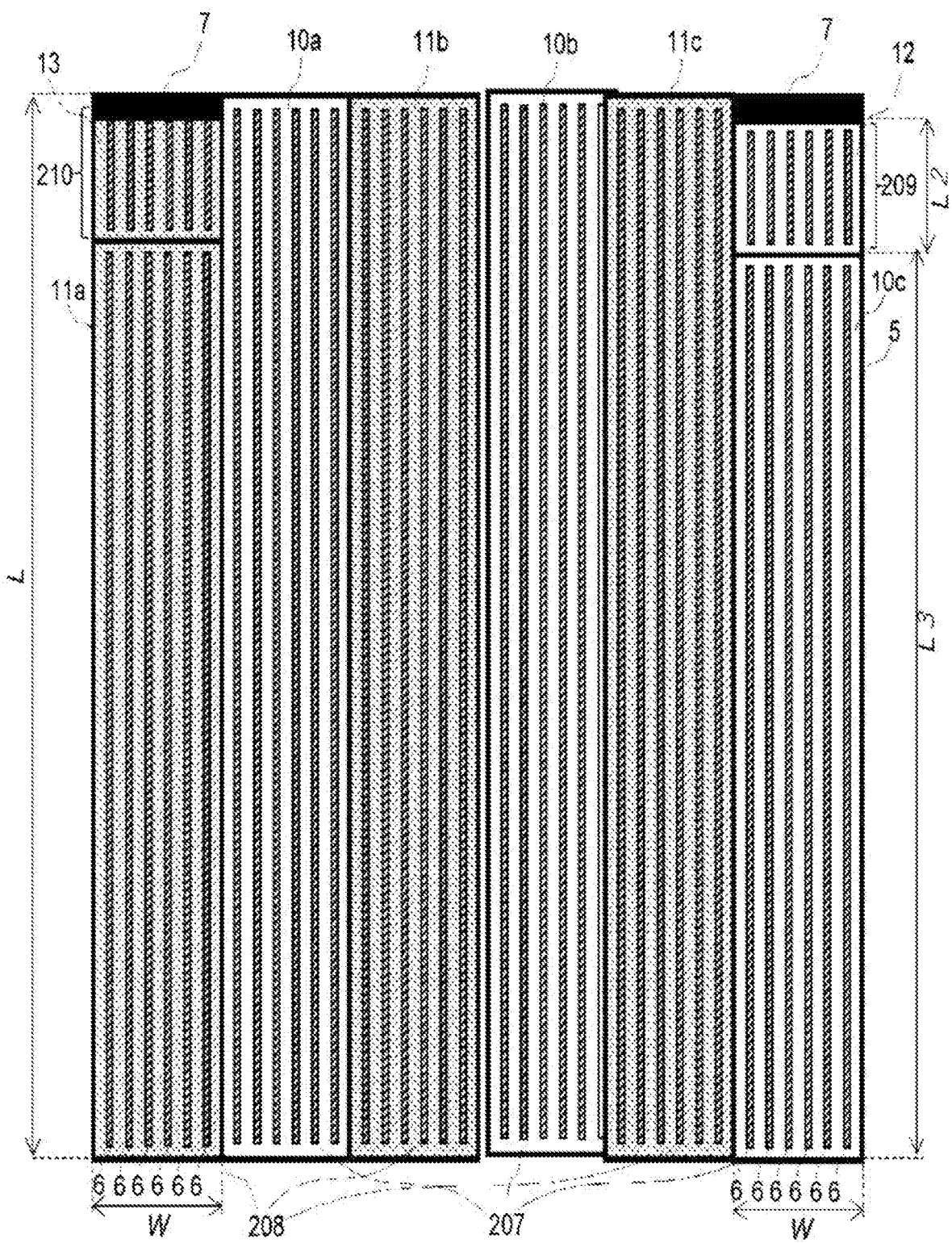
FIG. 7 is a plan view of a semiconductor device according to Embodiment 4.

FIG. 7 is a plan view of a semiconductor device according to Embodiment 4. A circuit diagram of an electric current drive circuit according to Embodiment 4 is similar to the circuit diagram illustrated in FIG. 6 according to Embodiment 3.

FIG. 7 illustrates an arrangement according to Embodiment 4. The semiconductor device according to Embodiment 4 is different from the semiconductor device according to Embodiment 3 illustrated in FIG. 5 in that the high-side sense transistor portion 13 of the high-side sense MOS transistor 210 is disposed adjacent on only one side to one 11a of the output transistor portions 11a, 11b, 11c, and 11d of the high-side output MOS transistor 208, and that the low-side sense transistor portion 12 of the low-side sense MOS transistor 209 is disposed adjacent on only one side to one 10c of the output transistor portions 10a, 10b, 10c, and 10d of the low-side output MOS transistor 207. According to Embodiment 4, as is the case with Embodiment 3, the high-side output transistor portions 11 of the high-side output MOS transistor 208 and the low-side output transistor portions 10 of the low-side output MOS transistor 207 alternately disposed so as to fill each other's spaced intervals. With respect to either one of the groups, the distance d according to Embodiment 2 and the width W are equal to each other. According to the present embodiment, since the low-side output transistor portions 10 and the high-side output transistor portions 11 are disposed with no gaps therebetween, the chip area of the output MOS transistor can efficiently be utilized.

The above points of Embodiment 4 are similar to those of Embodiment 3. According to Embodiment 4, as is the case with Embodiment 2, the low-side sense transistor portion 12 has, on a side thereof opposite the side adjacent to the low-side output transistor portion 10c, a trench groove 7 having a larger heat resistance than the trench groove 5 on the other sides. Likewise, the high-side sense transistor portion 13 has, on a side thereof opposite the side adjacent to the high-side output transistor portion 11a, a trench groove 7 having a larger heat resistance than the trench groove 5. Since the heat resistance of the trench groove 7 is larger than the heat resistance of the trench groove 5, heat generated by the sense MOS transistor 209 is restrained from being radiated from the trench groove 7. With this arrangement, the difference between the internal temperatures of the low-side output MOS transistor 207 and the low-side sense MOS transistor 209 is restrained from increasing, reducing the dependency of the sense ratio on the drive current, while at the same time the low-side sense transistor portion 12 can be disposed at a corner of the entire transistor assembly including the low-side sense transistor portion 12 and the low-side output transistor portions 10. As a result, the regularity of the interconnect layout of the low-side output MOS transistor 207 is increased furthermore.

In addition, the difference between the internal temperatures of the high-side output MOS transistor 208 and the high-side sense MOS transistor 210 is restrained from increasing, reducing the dependency of the sense ratio on the drive current, while at the same time the high-side sense transistor portion 13 can be disposed at a corner of the entire transistor assembly including the high-side sense transistor portion 13 and the high-side output transistor portions 11. As a result, the regularity of the interconnect layout of the high-side output MOS transistor 208 is increased furthermore.

In Embodiment 4, each of the high-side and low-side sense transistor portions is disposed at a corner of the entire transistor assembly. However, only either one of them may be of such arrangement, and the other may be of an arrangement similar to Embodiment 3.

Each of the embodiments described above is illustrated by way of example, and does not limit the scope of the present invention. Those skilled in the art can reduce the present invention to practice in various other forms without departing from the scope of the invention.

DESCRIPTION OF REFERENCE CHARACTERS

3: Output transistor portion
4: Sense transistor portion
5: Trench groove
6: Gate electrode
7: Trench groove
10: Low-side output transistor portion
11: High-side output transistor portion
12: Low-side sense transistor portion
13: High-side sense transistor portion
103: Electric current detecting circuit
104: Controller
105: Power supply
106: Output MOS transistor
107: Sense MOS transistor
202: External load
203: Low-side electric current detecting circuit
204: High-side electric current detecting circuit
205: Controller
206: Power supply
207: Low-side output MOS transistor
208: High-side output MOS transistor
209: Low-side sense MOS transistor
210: High-side sense MOS transistor

The invention claimed is:
1. A semiconductor device comprising:
an output MOS transistor that has an output transistor portion including a source, a gate, and a drain formed on a semiconductor chip, and that outputs an electric current for driving an external load; and
a sense MOS transistor that has a sense transistor portion including a source, a gate, and a drain formed on the semiconductor chip, and having a width equal to a transverse width of the output transistor portion, and that detects the electric current output from the output MOS transistor,
wherein
the sense transistor portion is disposed longitudinally in line with the output transistor portion such that a transverse side of the output transistor portion and a side of the sense transistor portion, the side having a same width as the transverse width of the output transistor portion, are adjacent to each other,
and wherein
a plurality of the output transistor portions are provided, and
the sense transistor portion is disposed such that a side of the sense transistor portion, the side having a same width as the transverse width of the output transistor portion, is adjacent to a transverse side of either one of the output transistor portions.

2. The semiconductor device according to claim 1, wherein
the sense MOS transistor is of a same unit structure as the output MOS transistor.

3. The semiconductor device according to claim 1, wherein
the plurality of output transistor portions have longitudinal directions parallel to each other and are arrayed in transverse directions, and the sense transistor portion is disposed longitudinally adjacent to one of the output transistor portions that is disposed on a transversely outermost side.

4. The semiconductor device according to claim 3, wherein
the plurality of output transistor portions are disposed in a transverse array at spaced intervals each equal to or larger than the transverse width of the output transistor portions.

5. The semiconductor device according to claim 1, wherein
each of the output transistor portion and the sense transistor portion has four sides surrounded by electrically insulative heat insulators.

6. A semiconductor device comprising:
an output MOS transistor that has an output transistor portion including a source, a gate, and a drain formed on a semiconductor chip, and that outputs an electric current for driving an external load; and
a sense MOS transistor that has a sense transistor portion including a source, a gate, and a drain formed on the semiconductor chip, and having a width equal to a transverse width of the output transistor portion, and that detects the electric current output from the output MOS transistor,
wherein
each of the output transistor portion and the sense transistor portion has four sides surrounded by electrically insulative heat insulators, and
wherein
two of the output transistor portions are disposed longitudinally in line with the output transistor portion in sandwiching relation to the sense transistor portion such that a transverse side of the output transistor portion and a side of the sense transistor portion, the side having a same width as the transverse width of the output transistor portion, are adjacent to each other.

7. The semiconductor device according to claim 1, wherein
the output transistor portion has a transverse length equal to or smaller than $\frac{1}{5}$ of a longitudinal length of the output transistor portion.

* * * * *